United States Patent
Lin et al.

(10) Patent No.: US 8,476,110 B2
(45) Date of Patent: Jul. 2, 2013

(54) METHOD OF MANUFACTURING STORAGE APPARATUS

(71) Applicant: Phison Electronics Corp., Miaoli (TW)

(72) Inventors: Wei-Hung Lin, Hsinchu County (TW); Chun-Feng Lee, Hsinchu (TW); Chang-Chih Chen, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 0 days.

(21) Appl. No.: 13/747,025

(22) Filed: Jan. 22, 2013

(65) Prior Publication Data
US 2013/0133191 A1    May 30, 2013

Related U.S. Application Data

(62) Division of application No. 12/871,120, filed on Aug. 30, 2010, now Pat. No. 8,393,907.

(30) Foreign Application Priority Data

Jul. 21, 2010 (TW) ................................ 99124005 A

(51) Int. Cl.
*H01L 21/00* (2006.01)

(52) U.S. Cl.
USPC ............. 438/107; 438/106; 438/117; 29/856; 29/832; 29/883; 439/81

(58) Field of Classification Search
USPC ............ 438/107, 106, 117, 119, 612; 29/856, 29/832, 883; 439/70–73, 75–81, 660, 680; 264/272.14
See application file for complete search history.

(56) References Cited

U.S. PATENT DOCUMENTS

| 5,313,364 | A  | * | 5/1994  | Omori et al. ............... 361/737 |
| 5,414,597 | A  | * | 5/1995  | Lindland et al. ............ 361/816 |
| 6,676,419 | B1 | * | 1/2004  | Lin et al. .................... 439/76.1 |
| 6,940,153 | B2 | * | 9/2005  | Spencer et al. ............. 257/659 |
| 2001/0044227 | A1 | * | 11/2001 | Boutros et al. ............. 439/76.1 |
| 2008/0017970 | A1 |   | 1/2008  | Yu |
| 2009/0093136 | A1 | * | 4/2009  | Hiew et al. ................. 439/55 |
| 2011/0003493 | A1 | * | 1/2011  | Mo et al. ................... 439/81 |

FOREIGN PATENT DOCUMENTS

TW          M380599         5/2010

OTHER PUBLICATIONS

"Office Action of Taiwan counterpart application" issued on Mar. 29, 2013, p. 1-p. 5, in which the listed references were cited.

* cited by examiner

*Primary Examiner* — Renee S Luebke
*Assistant Examiner* — Harshad Patel
(74) *Attorney, Agent, or Firm* — J.C. Patents

(57) ABSTRACT

A storage apparatus including a circuit board, a control circuit element, a terminal module and a storage circuit element is provided. The circuit board includes a first surface, a second surface, a connect part, openings, metal contacts and metal units. The openings pass through the circuit board from the first surface to the second surface and the metal contacts are exposed on the first surface. The terminal module is disposed on the first surface and has elastic terminals and each of the elastic terminals has a first contact part and a second contact part. The first contact parts respectively contact with the metal contacts and the second contact parts respectively pass through the openings to protrude from the second surface. The metal units are disposed on the second surface and located between the openings and the connect part. Accordingly, the volume of the storage apparatus can be reduced.

17 Claims, 7 Drawing Sheets

METHOD OF MANUFACTURING STORAGE APPARATUS

CROSS-REFERENCE TO RELATED APPLICATION

This application is a divisional of and claims the priority benefit of U.S. application Ser. No. 12/871,120 filed on Aug. 30, 2010, now allowed, which claims the priority benefit of Taiwan application serial no. 99124005, filed on Jul. 21, 2010. The entirety of each of the above-mentioned patent applications is hereby incorporated by reference herein and made a part of specification.

BACKGROUND

1. Technology Field

The present invention relates to a storage apparatus and a method of manufacturing this storage apparatus, and particularly relates to a storage apparatus adopting a non-volatile memory as storage medium and a method of manufacturing this storage apparatus.

2. Description of Related Art

With the developments of multimedia technology, storage capacity required for digital data goes larger and larger. Conventional floppy disk in 1.44 MB features in its portable characteristic but still fails to meet the requirement of large storage capacity. Although a conventional hard disk provides a large storage capacity, it still suffers in bulk size which leads to inconvenient carrying. Rewritable non-volatile memory is one of the most adaptable memories for such battery-powered portable products due to its characteristics such as data non-volatility, low power consumption, small volume, and non-mechanical structure. A flash drive is a storage apparatus adopting NAND flash memory as storage medium.

In general, a flash drive includes a circuit board, a control circuit element, a storage circuit element, and a plurality of elastic terminals and metal units (also referred to as a connector or a connect interface) used for connecting with a host. Although miniaturization of the control circuit element and the storage circuit element can make the flash drive smaller, it is difficult to further reduce the volume of the flash drive due to the size of the connector. Thereby, how to dispose the control circuit element, the storage circuit element and the connector to reduce the volume of the flash drive is one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a storage apparatus and a method of manufacturing this storage apparatus capable of effectively reducing the volume of the storage apparatus.

According to an exemplary embodiment of the present invention, a storage apparatus including a circuit board, a control circuit element, a terminal module and a storage circuit element is provided. The circuit board includes a first surface, a second surface being opposite to the first surface, a connect part, a plurality of openings, a plurality of metal contacts and a plurality of metal units, wherein the openings pass through the circuit board from the first surface to the second surface, the metal contacts are exposed on the first surface and each of the metal contacts is disposed corresponding to each of the openings. The control circuit element is disposed on the circuit board. The terminal module is disposed on the first surface, wherein the terminal module has a plurality of elastic terminals, each of the elastic terminals has a first contact part and a second contact part, the first contact parts respectively contact with the metal contacts and the second contact parts respectively pass through the openings to protrude from the second surface. The storage circuit element is disposed on the circuit board and coupled to the control circuit element. The metal units are disposed on the second surface, wherein the metal units are located between the openings and the contact part and coupled with the control circuit element.

According to an exemplary embodiment of the present invention, the above-described terminal module further has a fixture structure, each of the elastic terminals further has a fixture part and the fixture parts of the elastic terminals are fixed in the fixture structure.

According to an exemplary embodiment of the present invention, a shape of the above-described fixture structure is a long shape, the first contact parts protrude from a side of the fixture structure and the second contact parts protrude from another side of the fixture structure.

According to an exemplary embodiment of the present invention, the above-described fixture structure includes a front surface, a back surface and four side surfaces, the front surface has a slot, the second contact parts are in the slot and the first contact parts protrude from one of the four side surfaces, wherein the front surface of the fixture structure faces the first surface of the circuit board.

In an embodiment of the present invention, the above-described storage circuit element is disposed on the first surface of the circuit board.

In an embodiment of the present invention, the above-described storage circuit element is disposed on the second surface of the circuit board.

In an embodiment of the present invention, the above-described storage circuit element includes a first storage circuit module and a second storage circuit module, the first storage circuit module is disposed on the first surface and the second storage circuit module is disposed on the second surface.

In an embodiment of the present invention, the above-described storage apparatus further comprises a molding compound on the first surface, wherein the above-described control circuit element is disposed on the first surface, and the molding compound covers the control circuit element, the terminal module and the storage circuit element.

In an embodiment of the present invention, an arrangement of the above-described elastic terminals and the above-described metal units on the second surface complies with a universal serial bus (USB) 3.0 standard.

According to an exemplary embodiment of the present invention, a method of manufacturing a storage apparatus is provided. The method includes providing a circuit board, wherein the circuit board includes a first surface, a second surface being opposite to the first surface, a connect part, a plurality of openings, a plurality of metal contacts and a plurality of metal units, wherein the openings pass through the circuit board from the first surface to the second surface, the metal contacts are exposed on the first surface and each of the metal contacts is disposed corresponding to each of the openings. The method also includes forming a plurality of metal units on the second surface, wherein the metal units are located between the openings and the contact part. The method still includes bonding a control circuit element to the circuit board and coupling the control circuit element with the metal units. The method also includes bonding a terminal module to the first surface of the circuit board, wherein the terminal module has a plurality of elastic terminals, each of the elastic terminals has a first contact part and a second contact part, the first contact parts respectively contact with the metal contacts and the second contact parts respectively pass through the openings to protrude from the second surface. The method further includes bonding a storage circuit element to the circuit board and coupling the storage circuit element with the control circuit element.

According to an exemplary embodiment of the present invention, the above-described terminal module further a fixture structure, a shape of the fixture structure is rectangular, the first contact parts protrude from a side of the fixture structure and the second contact parts protrude from another side of the fixture structure. And, the step of bonding the terminal module to the first surface of the circuit board includes bonding the fixture structure to the first surface of the circuit board.

According to an exemplary embodiment of the present invention, the above-described terminal module further a fixture structure, the fixture structure further includes a front surface, a back surface and four side surfaces, the front surface has a slot, the second contact parts are in the slot and the first contact parts protrude from one of the four side surfaces. And, the step of bonding the terminal module to the first surface of the circuit board includes making the front surface of the fixture structure to face the first surface of the circuit board and bonding the fixture structure to the first surface of the circuit board.

In an embodiment of the present invention, the step of bonding the storage circuit element to the circuit includes bonding the storage circuit element to the first surface of the circuit board.

In an embodiment of the present invention, the step of bonding the storage circuit element to the circuit includes bonding the storage circuit element to the second surface of the circuit board.

In an embodiment of the present invention, the above-described storage circuit element includes a first storage circuit module and a second storage circuit module, the first storage circuit module is disposed on the first surface and the second storage circuit module is disposed on the second surface, and the step of bonding the storage circuit element to the circuit includes bonding the first storage circuit module to the first surface and bonding the second storage circuit module to the second surface.

In an embodiment of the present invention, the method of manufacturing a storage apparatus further includes forming a molding compound on the first surface to cover the control circuit element, the terminal module and the storage circuit element.

Based on the above, the storage apparatus can have a smaller volume.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
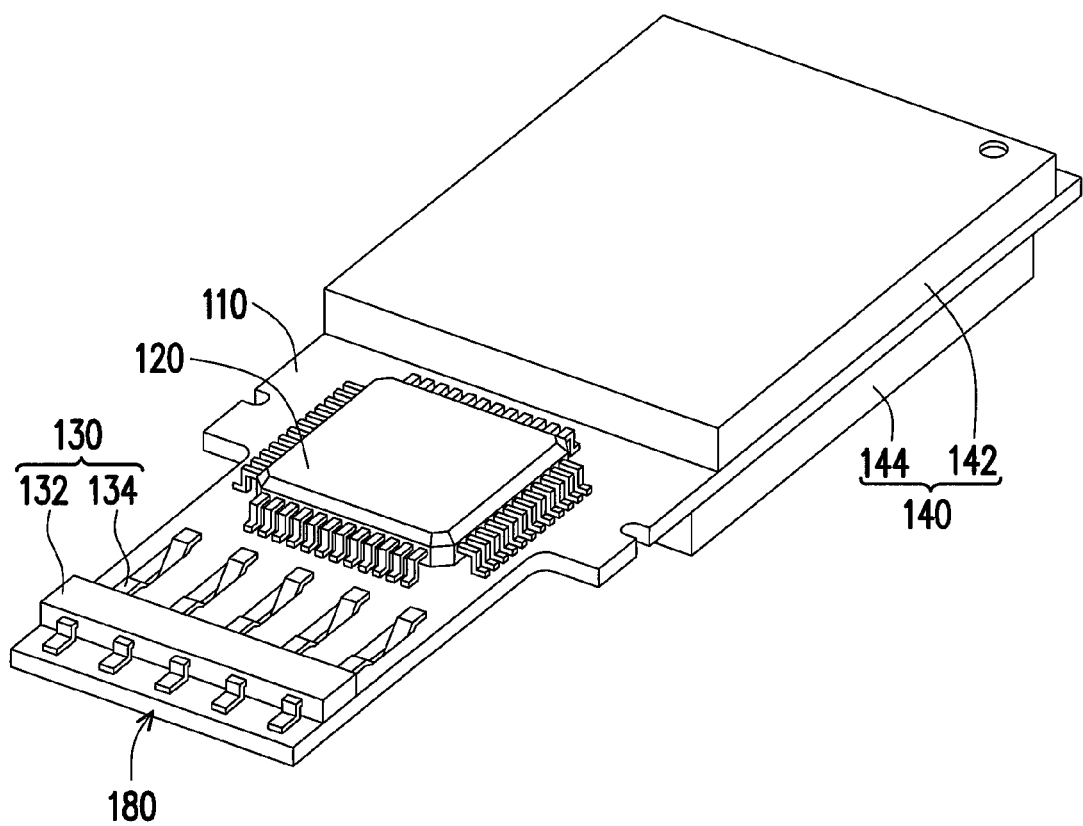
FIG. 1 is a three-dimensional diagram illustrating a storage apparatus according to a first exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
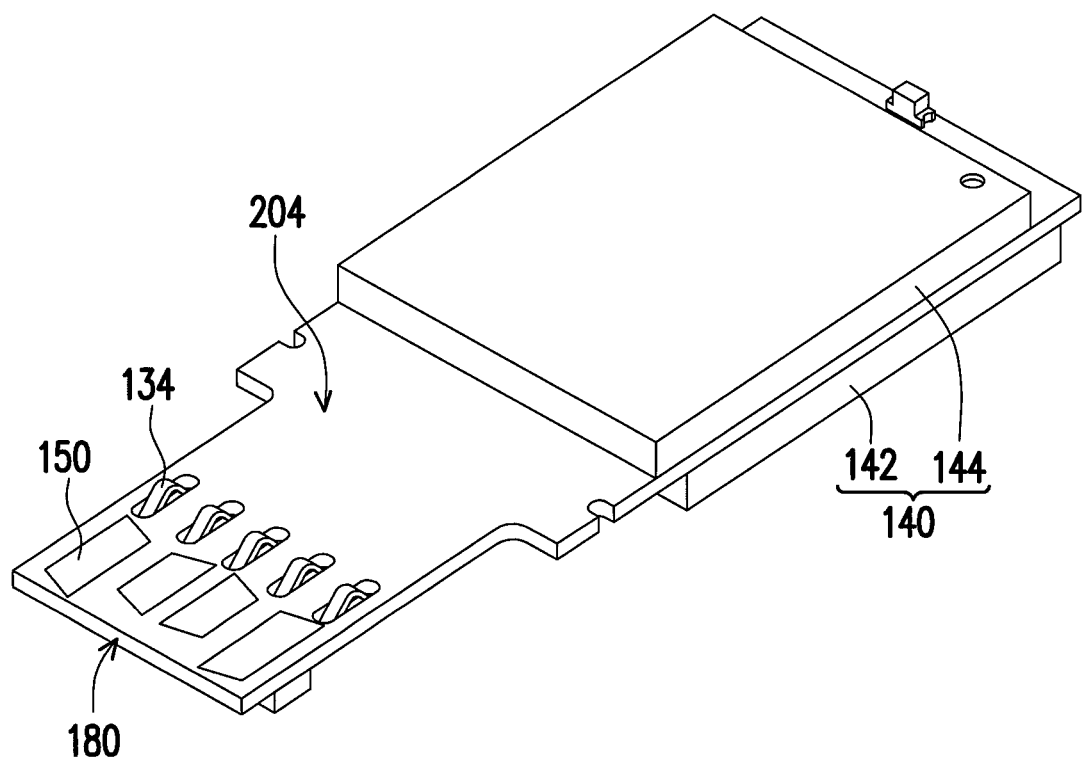
FIG. 2 is another three-dimensional diagram illustrating the storage apparatus according to the first exemplary embodiment of the invention.
Figure 3:
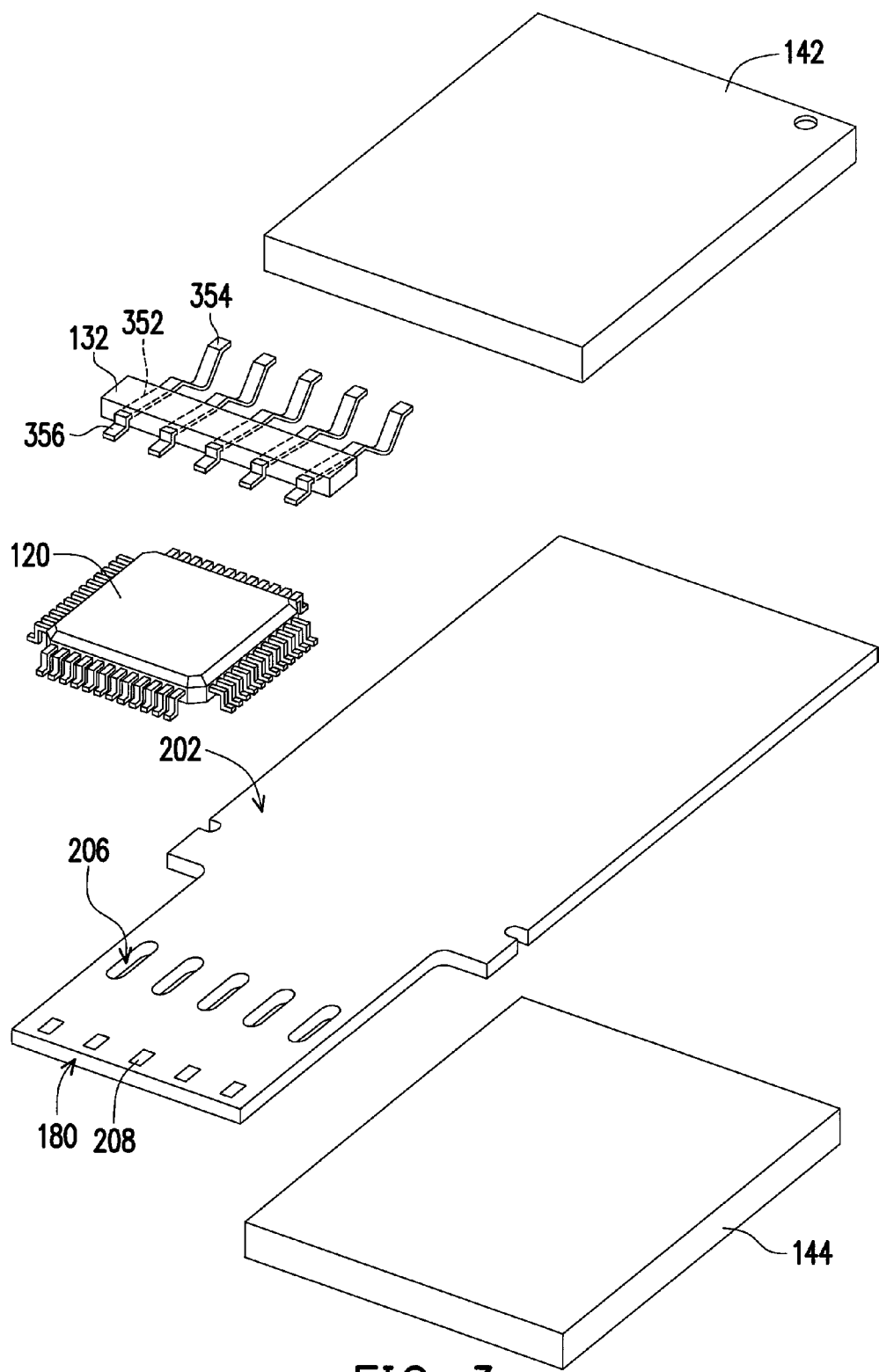
FIG. 3 is an exploded view of a portion of the storage apparatus according to FIG. 1.

FIG. 1 is a three-dimensional diagram illustrating a storage apparatus according to a first exemplary embodiment of the invention, FIG. 2 is another three-dimensional diagram illustrating the storage apparatus according to the first exemplary embodiment of the invention and FIG. 3 is an exploded view of a portion of the storage apparatus according to FIG. 1.

Referring to FIG. 1, FIG. 2 and FIG. 3, the storage apparatus includes a circuit board 110, a control circuit element 120, a terminal module 130 and a storage circuit element 140. In the present exemplary embodiment, the control circuit element 120, the terminal module 130 and the storage circuit element 140 may be mounted on the circuit board 110 with a surface mount technology (SMT).

The circuit board 110 has a first surface 202, a second surface 204 and a connect part 180. A plurality of circuit elements may be disposed on the first surface 202 and the second surface 204 of the circuit board 110, and the circuit elements are electrically connected via the leads that are disposed on the circuit board 110. The connect part 180 is used for connecting to a corresponding connector of a host system. That is, the storage apparatus is plugged in the host system along the connect part 180. In the present exemplary embodiment, the circuit board 110 has a plurality of openings 206 and a plurality of metal contacts 208. The openings 206 pass through the circuit board 110 from the first surface 202 to the second surface 204, and the metal contacts 208 are exposed on the first surface 202 and located between the connect part 180 and the openings 206. In particular, the metal contacts 206 are disposed respectively corresponding to the openings 206. For example, in this exemplary embodiment, each of the metal contacts is corresponding to one opening. However, it should be noted that in another exemplary embodiment, several metal contacts may be corresponding to one opening.

The control circuit element 120 is a main control circuit of the storage apparatus. For example, the control circuit element 120 includes a micro processing unit, a buffer memory, a host interface module, a flash memory interface module, an error checking and correcting module, a power management module, and so on. The control circuit element 120 is disposed on the first surface 202 of the circuit board 110, and the openings 206 are located between the metal contacts 208 and the control circuit element 120. It should be noted that the control circuit element 120 may be disposed on the second surface 204 of the circuit board 110.

The terminal module 130 is disposed on the first surface 202 of the circuit board 110. The terminal module 130 includes a fixture structure 132 and a plurality of elastic terminals 134. In the present exemplary embodiment of the present invention, the fixture structure 132 is used for fixing the elastic terminals 134 on the circuit board 110. However, the present invention is not limited thereto, and in another exemplary embodiment of the present invention, the elastic terminals 134 may be welded directly on the first surface 202 of the circuit board 202 without the fixture structure 132.

In the present exemplary embodiment, the shape of the fixture structure 132 is a long shape. However, the present invention is not limited thereto, and in another embodiment of the present invention, the shape of the fixture structure 132 may be a cylinder shape or other shapes.

Each of the elastic terminals 134 has a fixture part 352, a second contact part 354 and a first contact part 356. The fixture parts 352 of the elastic terminals 134 are fixed in the fixture structure 132, the second contact parts 354 of the elastic terminals 134 protrude from a side of the fixture structure 132 and the first contact parts 356 of the elastic terminals 134 protrude from another side of the fixture structure 132. In particular, the second contact parts 354 respectively pass through the openings 206 to protrude from the second surface 204 and the first contact parts 356 respectively contact with the metal contacts 208.

The storage circuit element 140 is disposed on the circuit board 110 and used for storing data. In the present exemplary embodiment, the storage circuit element 140 is a non-volatile memory circuit element. For example, the storage circuit element 140 may be a multi level cell (NLC) NAND flash memory circuit element. However, it must be understood that the present invention is not limited thereto. In another embodiment of the present invention, the aforementioned non-volatile memory circuit element may be a single level cell (SLC) NAND flash memory circuit or other writable non-volatile memory circuit element.

The storage circuit element 140 includes a first storage circuit module 142 and a second storage circuit module 144, wherein the first storage circuit module 142 is disposed on the first surface 202 of the circuit board 110 and the second storage circuit module 144 is disposed on the second surface 204 of the circuit board 110.

It should noted that although the storage circuit element 140 includes both the first storage circuit module 142 disposed on the first surface 202 and the second storage circuit module 144 disposed on the second surface 204 in the present exemplary embodiment, the present invention is not limited thereto. In another exemplary embodiment of the present invention, only one of the first storage circuit module 142 and the second storage module 144 is disposed on the circuit board 110. That is, the storage circuit element 140 only includes the first storage circuit module 142 disposed on the first surface 202 (or the second storage circuit module 144 disposed on the second surface 204).

In the present exemplary embodiment of the invention, the circuit board 110 further comprises a plurality of metal units 150. The metal units 150 are disposed on the second surface 204 of the circuit board 110 and located between the openings 206 and the connect part 180. In the present exemplary embodiment, on the second surface 204, an arrangement of the metal units 150 and the second contact parts 354 protruded from the second surface 204 complies with a universal serial bus (USB) 3.0 standard.

Figure 4:
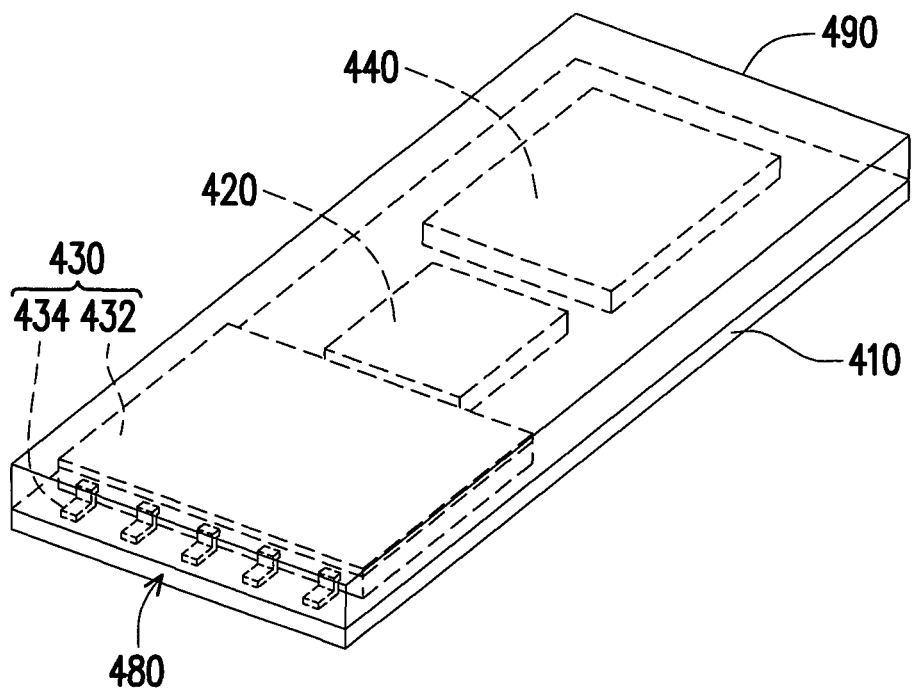
FIG. 4 is a three-dimensional diagram illustrating a storage apparatus according to a second exemplary embodiment of the invention.
Figure 5:
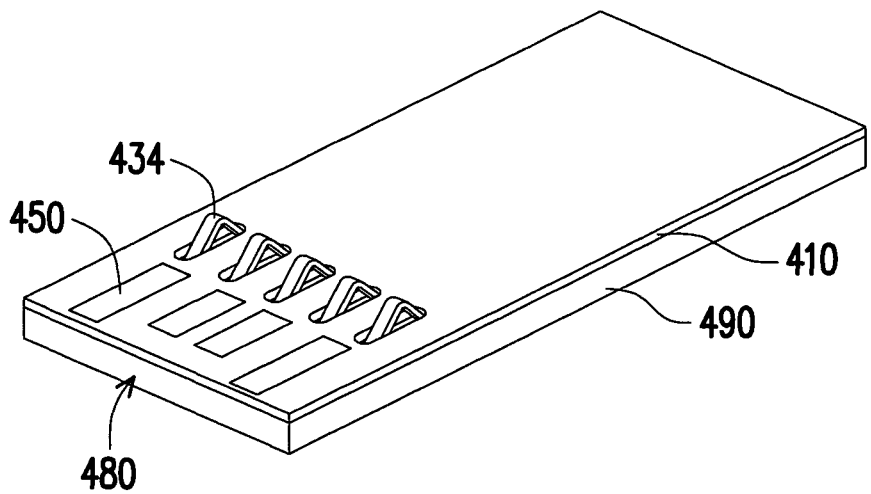
FIG. 5 is another three-dimensional diagram illustrating the storage apparatus according to the second exemplary embodiment of the invention.
Figure 6:
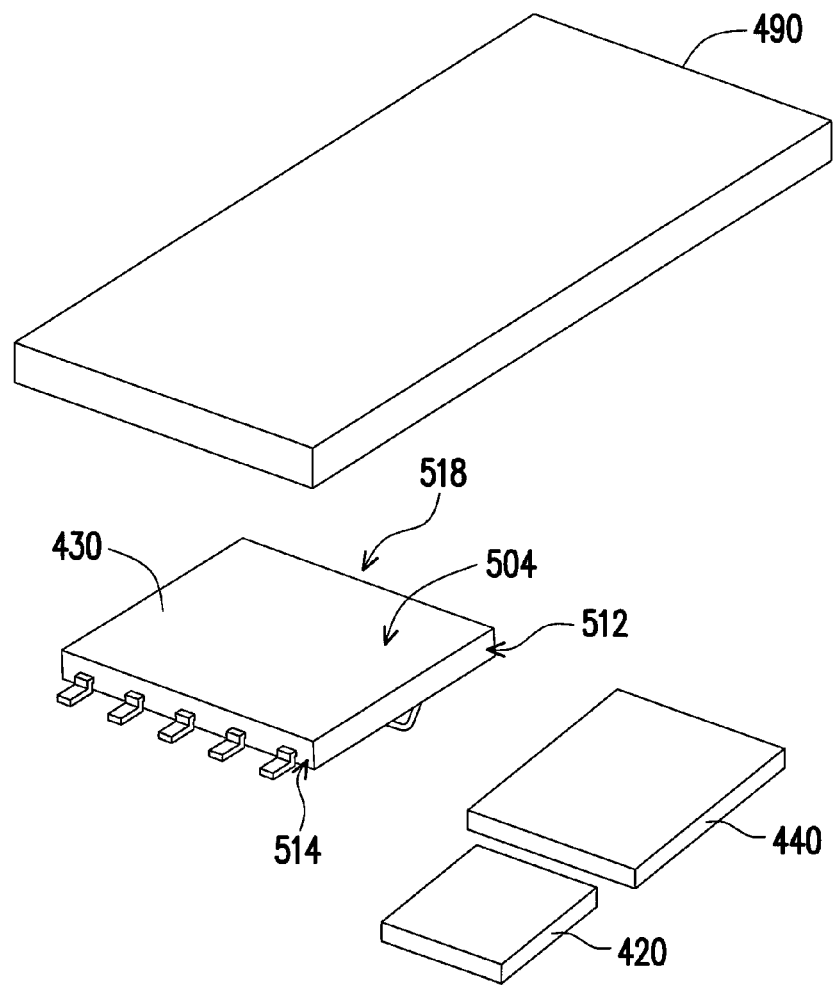
FIG. 6 is an exploded view of a portion of the storage apparatus according to FIG. 4.
Figure 7:
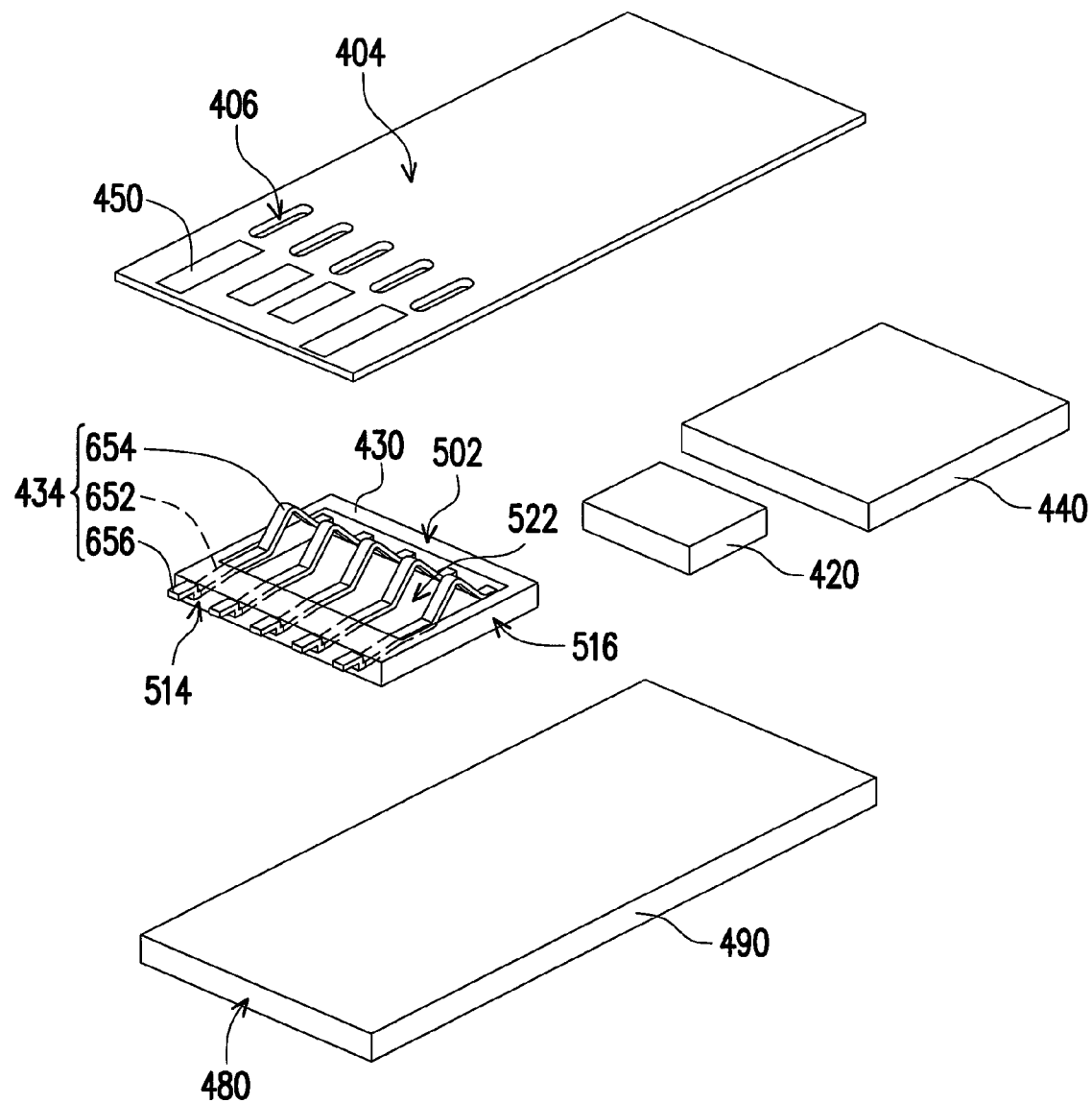
FIG. 7 is an exploded view of a portion of the storage apparatus according to FIG. 5.

FIG. 4 is a three-dimensional diagram illustrating a storage apparatus according to a second exemplary embodiment of the invention, FIG. 5 is another three-dimensional diagram illustrating the storage apparatus according to the second exemplary embodiment of the invention, FIG. 6 is an exploded view of a portion of the storage apparatus according to FIG. 4, and FIG. 7 is an exploded view of a portion of the storage apparatus according to FIG. 5.

Referring to FIG. 4, FIG. 5 and FIG. 6, the storage apparatus includes a circuit board 410, a control circuit element 420, a terminal module 430, a storage circuit element 440 and a molding compound 490. In the present exemplary embodiment, the control circuit element 420, the terminal module 430 and the storage circuit element 440 may be packaged by using the molding compound 490 with a system in package (SIP) technology.

The circuit board 410 has a first surface 402, a second surface 404 and a connect part 480. A plurality of circuit elements may be disposed on the first surface 402 and the second surface 404 of the circuit board 410, and the circuit elements are electrically connected via the leads that are disposed on the circuit board 410.

In the present exemplary embodiment, the circuit board 410 has a plurality of openings 406 and a plurality of metal contacts 408. The openings 406 pass through the circuit board 410 from the first surface 402 to the second surface 404, and the metal contacts 408 are exposed on the first surface 402 and located between the connect part 480 and the openings 406. In particular, the metal contacts 406 are disposed respectively corresponding to the openings 406. That is, one metal contact is corresponding to one opening.

The control circuit element 420 is a main control circuit of the storage apparatus. For example, the control circuit element 420 includes a micro processing unit, a buffer memory, a host interface module, a flash memory interface module, an error checking and correcting module, a power management module, and so on. The control circuit element 420 is disposed on the first surface 402 of the circuit board 410, and the openings 406 are located between the metal contacts 408 and the control circuit element 420.

The terminal module 430 is disposed on the first surface 402 of the circuit board 410. The terminal module 430 includes a fixture structure 432 and a plurality of elastic terminals 434.

In the present exemplary embodiment, the fixture structure 432 has a front surface 502, a back surface 504 and four side surfaces (i.e., side surfaces 512, 514, 516 and 518). In particular, the front surface 502 of the fixture structure 432 faces the first surface 402 of the circuit board 410 and has a slot 522.

Each of the elastic terminals 434 has a fixture part 652, a second contact part 654 and a first contact part 656. The fixture parts 652 of the elastic terminals 434 are fixed in the fixture structure 432, the second contact parts 654 of the elastic terminals 434 are in the slot 522 and the first contact parts 656 of the elastic terminals 434 protrude from the side surface 514 of the fixture structure 432. In particular, the second contact parts 654 respectively pass through the openings 406 to protrude from the second surface 406 and the first contact parts 656 respectively contact with the metal contacts 408.

The storage circuit element 440 is disposed on the first surface 402 of the circuit board 410. The storage circuit element 440 is a non-volatile memory circuit element for storing data. In the present exemplary embodiment, the storage circuit element 440 is a multi level cell (NLC) NAND flash memory circuit element. However, it must be understood that the present invention is not limited thereto. In another embodiment of the present invention, the storage circuit element 440 may be a single level cell (SLC) NAND flash memory circuit or other writable non-volatile memory circuit element.

In the present exemplary embodiment of the invention, the circuit board 410 further comprises a plurality of metal units 450. The metal units 450 are disposed on the second surface 404 of the circuit board 410 and located between the openings 406 and the connect part 480. In the present exemplary embodiment, on the second surface 404, an arrangement of the metal units 450 and the second contact parts 654 protruded from the second surface 404 complies with the USB 3.0 standard.

Figure 8:
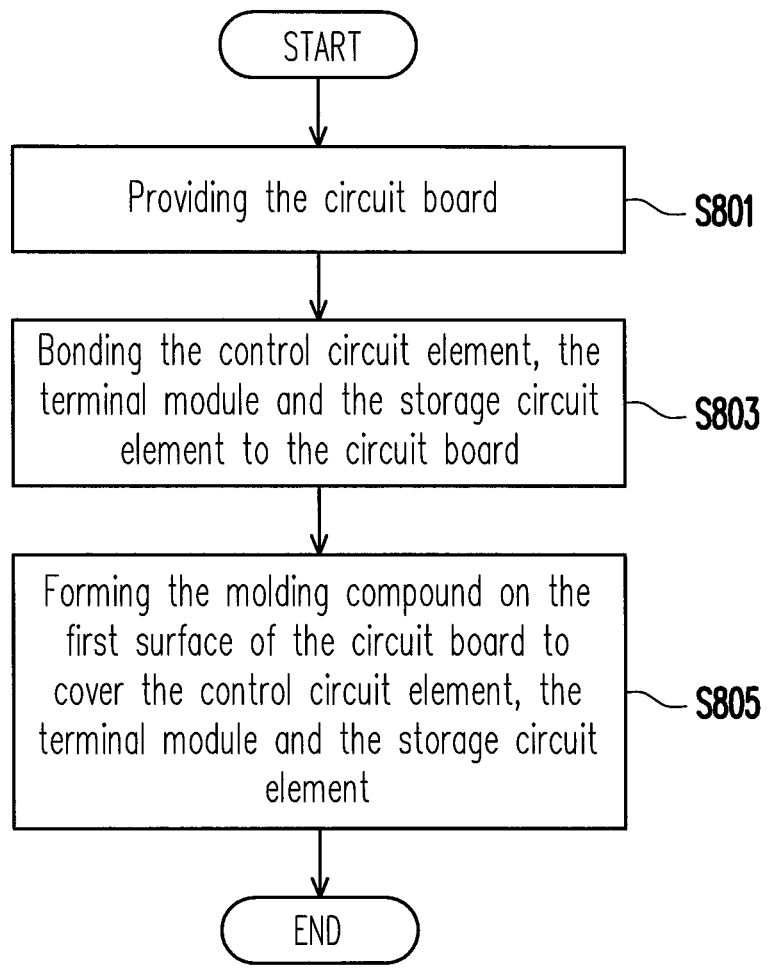
FIG. 8 is flow chart of a method of manufacturing the storage apparatus according to the second exemplary embodiment of the invention.

FIG. 8 is flow chart of a method of manufacturing the storage apparatus according to the second exemplary embodiment of the invention.

Referring to FIG. 8, fist, the circuit board 410 is provided (step S801). Then, the control circuit element 420, the terminal module 430 and the storage circuit element 440 are bonded to the circuit board 410 (step S803). To be specific, in step S803, the control circuit element 420 and the storage circuit element 440 are bonded to the first surface 402 of the circuit board 410. And, in step S803, the terminal module 430 is bonded to the first surface 402 of the circuit board 410, such that the first contact parts 656 of the elastic terminals 434 respectively contact with the metal contacts 408 and the second contact parts 654 of the elastic terminals 434 respectively pass through the openings 406 to protrude from the second surface 404 of the circuit board 410. For example, the control circuit element 420, the terminal module 430 and the storage circuit element 440 are bonded to the circuit board 410 with a wire bonding technology or a flip chip bonding technology.

After step S803, the molding compound 490 is formed on the first surface 402 of the circuit board 410 to cover the control circuit element 420, the terminal module 430 and the storage circuit element 440 (step S805).

In summary, the structure of the storage apparatus and the method of manufacturing the same according to the exemplary embodiments can effectively reduce the volume of the storage apparatus. The previously described exemplary embodiments of the present invention have the advantages aforementioned, wherein the advantages aforementioned not required in all versions of the invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of manufacturing a storage apparatus, comprising:

providing a circuit board, wherein the circuit board includes a first surface, a second surface being opposite to the first surface, a connect part, a plurality of openings and a plurality of metal contacts, the openings pass through the circuit board from the first surface to the second surface, the metal contacts are exposed on the first surface and each of the metal contacts is disposed corresponding to each of the openings;

forming a plurality of metal units on the second surface, wherein the metal units are located between the openings and the connect part;

bonding a control circuit element to the circuit board and coupling the control circuit element with the metal units;

bonding a terminal module to the first surface of the circuit board, wherein the terminal module has a plurality of elastic terminals, each of the elastic terminals has a first contact part and a second contact part, the first contact parts respectively contact with the metal contacts and the second contact parts respectively pass through the openings to protrude from the second surface; and bonding a storage circuit element to the circuit board and coupling the storage circuit element with the control circuit element.

2. The method according to claim 1, wherein the terminal module further has a fixture structure, a shape of the fixture structure is rectangular, the first contact parts protrude from a side of the fixture structure and the second contact parts protrude from another side of the fixture structure, wherein the step of bonding the terminal module to the first surface of the circuit board comprises:

bonding the fixture structures to the first surface of the circuit board.

3. The method according to claim 1, wherein the terminal module further has a fixture structure, the fixture structure further includes a front surface, a back surface and four side surfaces, the front surface has a slot, the second contact parts are in the slot and the first contact parts protrude from one of the four side surfaces, wherein the step of bonding the terminal module to the first surface of the circuit board comprises:

making the front surface of the fixture structure to face the first surface of the circuit board and bonding the fixture structure to the first surface of the circuit board.

4. The method according to claim 1, wherein the step of bonding the storage circuit element to the circuit board comprises:

bonding the storage circuit element to the first surface of the circuit board.

5. The method according to claim 1, wherein the step of bonding the storage circuit element to the circuit board comprises:

bonding the storage circuit element to the second surface of the circuit board.

6. The method according to claim 1, wherein the storage circuit element includes a first storage circuit module and a second storage circuit module, and the step of bonding the storage circuit element to the circuit board comprises:
   bonding the first storage circuit module to the first surface of the circuit board; and
   bonding the second storage circuit module to the second surface of the circuit board.

7. The method according to claim 3, further comprising:
   forming a molding compound on the first surface to cover the control circuit element, the terminal module and the storage circuit element.

8. The method according to claim 1, wherein an arrangement of the elastic terminals and the metal units on the second surface complies with a universal serial bus 3.0 standard.

9. The method according to claim 1,
   wherein the step of bonding the control circuit element to the circuit board comprises bonding the control circuit element to the second surface of the circuit board,
   the step of bonding the storage circuit element to the circuit board comprises bonding the storage circuit element to the second surface of the circuit board.

10. The method according to claim 9, further comprising:
    forming a molding compound on the second surface to cover the control circuit element and the storage circuit element.

11. The method according to claim 1, wherein the circuit board comprises a first region and a second region, a width of the first region is smaller than a width of the second region and the connect part is disposed in the first region,
    the step of bonding the control circuit element to the circuit board comprises:
    disposing the control circuit element between the first region and the second region.

12. A method of manufacturing a storage apparatus, comprising:
    providing a circuit board, wherein the circuit board includes a first surface, a second surface being opposite to the first surface, a connect part, a plurality of openings and a plurality of metal contacts, the openings pass through the circuit board from the first surface to the second surface, the metal contacts are exposed on the first surface and each of the metal contacts is disposed corresponding to each of the openings;
    forming a plurality of metal units on the second surface, wherein the metal units are located between the openings and the connect part;
    bonding a control circuit element to the first surface of the circuit board and coupling the control circuit element with the metal units;
    bonding a terminal module to the first surface of the circuit board, wherein the terminal module has a plurality of elastic terminals, each of the elastic terminals has a first contact part and a second contact part, the first contact parts respectively contact with the metal contacts and the second contact parts respectively pass through the openings to protrude from the second surface;
    bonding a storage circuit element to the first surface of the circuit board and coupling the storage circuit element with the control circuit element; and
    forming a molding compound on the first surface to cover the control circuit element, the terminal module and the storage circuit element.

13. The method according to claim 12, wherein the terminal module fully covers the openings.

14. The method according to claim 13, wherein the terminal module further has a fixture structure, the fixture structure further includes a front surface, a back surface and four side surfaces,
    wherein the step of bonding the terminal module to the first surface of the circuit board comprises:
    making the front surface of the fixture structure to face the first surface of the circuit board and form a slot, wherein the second contact parts are movable in the slot; and
    bonding the fixture structure to the first surface of the circuit board.

15. The method according to claim 12, wherein the terminal module further has a fixture structure, the fixture structure further includes a front surface, a back surface and four side surfaces, the front surface has a slot, the second contact parts are in the slot and the first contact parts protrude from one of the four side surfaces,
    wherein the step of bonding the terminal module to the first surface of the circuit board comprises:
    making the front surface of the fixture structure to face the first surface of the circuit board and bonding the fixture structure to the first surface of the circuit board.

16. The method according to claim 12, wherein the step of bonding the control circuit element to the first surface of the circuit board comprises:
    disposing the control circuit element between the terminal module and the storage circuit element on the first surface of the circuit board.

17. The method according to claim 12, wherein an arrangement of the elastic terminals and the metal units on the second surface complies with a universal serial bus 3.0 standard.

* * * * *